United States Patent
Greene et al.

(10) Patent No.: US 9,252,215 B2
(45) Date of Patent: Feb. 2, 2016

(54) CONSTRAINED EPITAXIAL SOURCE/DRAIN REGIONS ON SEMICONDUCTOR-ON-INSULATOR FINFET DEVICE

(71) Applicant: International Business Machines Corporation, Armonk, NY (US)

(72) Inventors: Brian J. Greene, Wappingers Falls, NY (US); Arvind Kumar, Beacon, NY (US); Dan M. Mocuta, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/827,535

(22) Filed: Aug. 17, 2015

(65) Prior Publication Data

US 2015/0357412 A1 Dec. 10, 2015

Related U.S. Application Data

(62) Division of application No. 14/225,769, filed on Mar. 26, 2014.

(51) Int. Cl.
| | |
|---|---|
| *H01L 29/161* | (2006.01) |
| *H01L 29/20* | (2006.01) |
| *H01L 29/08* | (2006.01) |
| *H01L 29/78* | (2006.01) |
| *H01L 29/06* | (2006.01) |
| *H01L 29/16* | (2006.01) |
| *H01L 29/165* | (2006.01) |

(52) U.S. Cl.
CPC ........ *H01L 29/0847* (2013.01); *H01L 29/0653* (2013.01); *H01L 29/16* (2013.01); *H01L 29/165* (2013.01); *H01L 29/785* (2013.01)

(58) Field of Classification Search
CPC .............. H01L 29/785; H01L 29/6681; H01L 27/1211
USPC ......................................................... 257/347
See application file for complete search history.

(56) References Cited

U.S. PATENT DOCUMENTS

| | | | |
|---|---|---|---|
| 7,655,533 | B2 | 2/2010 | Sheen et al. |
| 7,879,675 | B2 | 2/2011 | Radosavljevic et al. |
| 8,053,299 | B2 | 11/2011 | Xu |
| 8,310,013 | B2 | 11/2012 | Lin et al. |
| 8,367,485 | B2 * | 2/2013 | Chang et al. .................. 438/151 |
| 8,377,759 | B2 | 2/2013 | Cheng et al. |
| 8,435,846 | B2 | 5/2013 | Cheng et al. |

(Continued)

*Primary Examiner* — Cuong Q Nguyen
(74) *Attorney, Agent, or Firm* — Cantor Colburn LLP; Steven Meyers

(57) ABSTRACT

A method of fabricating a semiconductor device includes forming a plurality of semiconductor fins on an insulator layer of a semiconductor substrate, and forming a plurality of gate stacks on the insulator layer. Each gate stack wraps around a respective portion of the semiconductor fins. The method further includes forming a dielectric layer on the insulator layer. The dielectric layer fills voids between the semiconductor fins and gate stacks, and covers the semiconductor fins. The method further includes etching at least one portion of the semiconductor fins until reaching the insulator layer such that at least one cavity is formed. The cavity exposes seed regions of the semiconductor fins located between adjacent gate stacks. The method further includes epitaxially growing a semiconductor material from the seed regions to form source/drain regions corresponding to a respective gate stack.

9 Claims, 12 Drawing Sheets

(56) References Cited

U.S. PATENT DOCUMENTS

| | | |
|---|---|---|
| 8,441,072 B2 | 5/2013 | Tsai et al. |
| 8,455,313 B1 | 6/2013 | Basker et al. |
| 8,466,027 B2 | 6/2013 | Chen et al. |
| 8,603,894 B2 * | 12/2013 | Majumdar et al. ............ 438/429 |
| 9,129,863 B2 * | 9/2015 | Caimi et al. |
| 2006/0175669 A1 | 8/2006 | Kim et al. |
| 2011/0210393 A1 | 9/2011 | Chen et al. |
| 2013/0069171 A1 | 3/2013 | Cheng et al. |
| 2013/0161756 A1 | 6/2013 | Glass et al. |
| 2013/0175624 A1 | 7/2013 | Chang et al. |
| 2013/0187207 A1 | 7/2013 | Tang et al. |

* cited by examiner

CONSTRAINED EPITAXIAL SOURCE/DRAIN REGIONS ON SEMICONDUCTOR-ON-INSULATOR FINFET DEVICE

DOMESTIC PRIORITY

This application is a divisional of U.S. patent application Ser. No. 14/225,769, filed Mar. 26, 2014, the disclosure of which is incorporated by reference herein in its entirety.

BACKGROUND

The present invention generally relates to finFET semiconductor devices, and more specifically, to finFET semiconductor devices having epitaxially grown source/drain regions.

Semiconductor fabrication methods are formulated with the goal of improving speed and efficiency of the fabricated semiconductor device. Current semiconductor trends for fabricating bulk finFET devices include epitaxially growing the source/drain regions from an easily accessible seed layer formed on the bulk semiconductor substrate. The epitaxially grown source/drain regions have proven to provide a more uniform doping profile as compared to source/drain regions that are formed using traditional ion doping techniques. However, epitaxially growing source/drain regions on silicon-on-insulator (SOI) finFET devices has proven to be challenging since seed layers used to epitaxially grow the source/drain regions are typically located beneath the insulator layer.

SUMMARY

According to at least one embodiment, a method of fabricating a semiconductor device includes forming a plurality of semiconductor fins on an insulator layer of a semiconductor substrate, and forming a plurality of gate stacks on the insulator layer. Each gate stack wraps around a respective portion of the semiconductor fins. The method further includes forming a dielectric layer on the insulator layer. The dielectric layer fills voids between the semiconductor fins and gate stacks, and covers the semiconductor fins. The method further includes etching at least one portion of the semiconductor fins until reaching the insulator layer such that at least one cavity is formed. The cavity exposes seed regions of the semiconductor fins located between adjacent gate stacks. The method further includes epitaxially growing a semiconductor material from the seed regions to form source/drain regions corresponding to a respective gate stack.

According to another embodiment, a semiconductor device comprises a plurality of semiconductor fins formed on an insulator layer of a semiconductor substrate. Each semiconductor fin includes at least one pair of opposing seed regions. An epitaxial material is formed on the opposing seed regions and extends completely between the seed regions to define a corresponding source/drain region. The semiconductor device further includes at least one gate stack that is formed on the insulator layer. The at least one gate stack wraps around at least one seed region.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

DETAILED DESCRIPTION

Figure 1A:
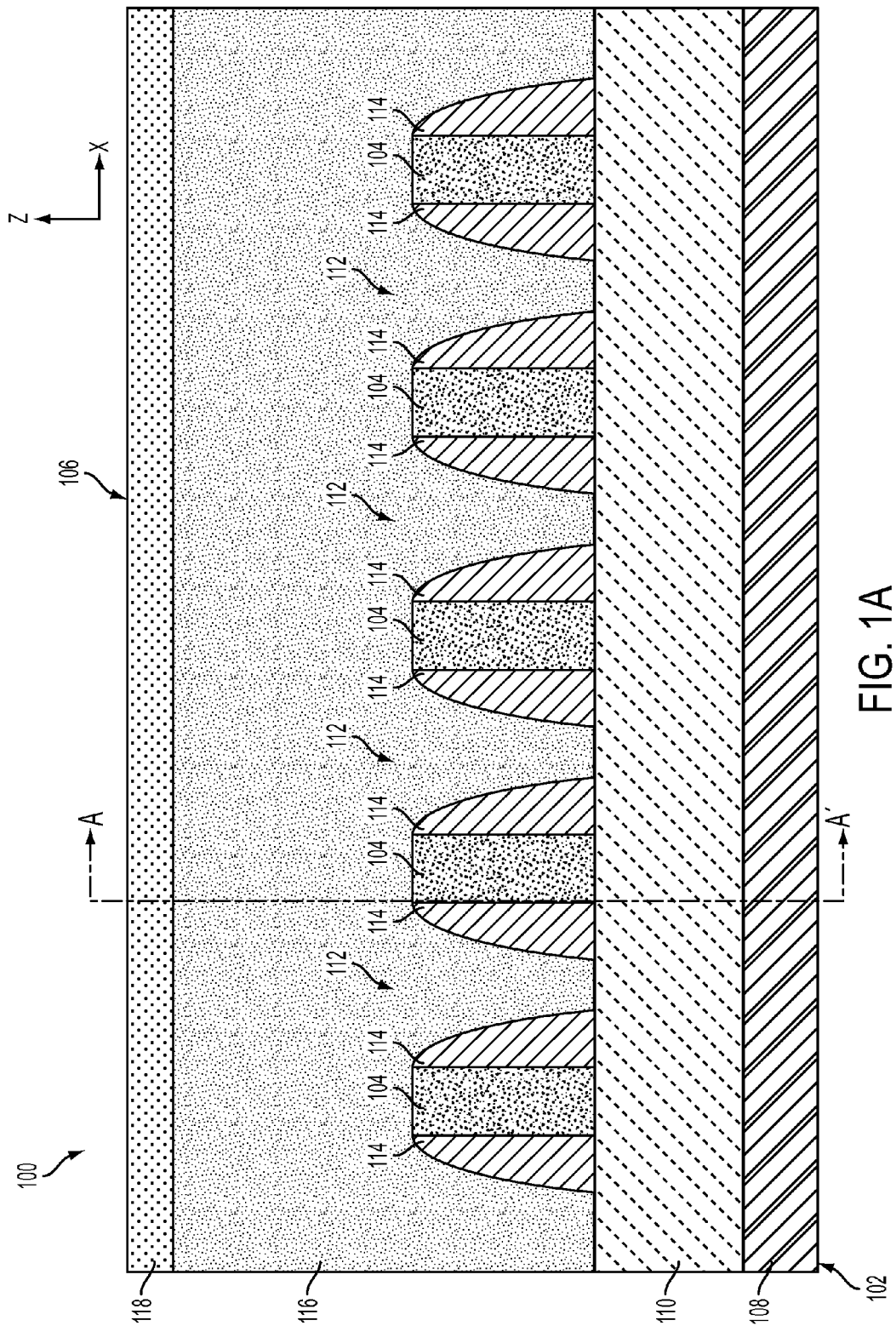
FIG. 1A illustrates a first orientation of a semiconductor device including a plurality of semiconductor fins formed on an insulator layer of an SOI substrate and a gate stack formed on the semiconductor fins according to an exemplary embodiment.
Figure 1B:
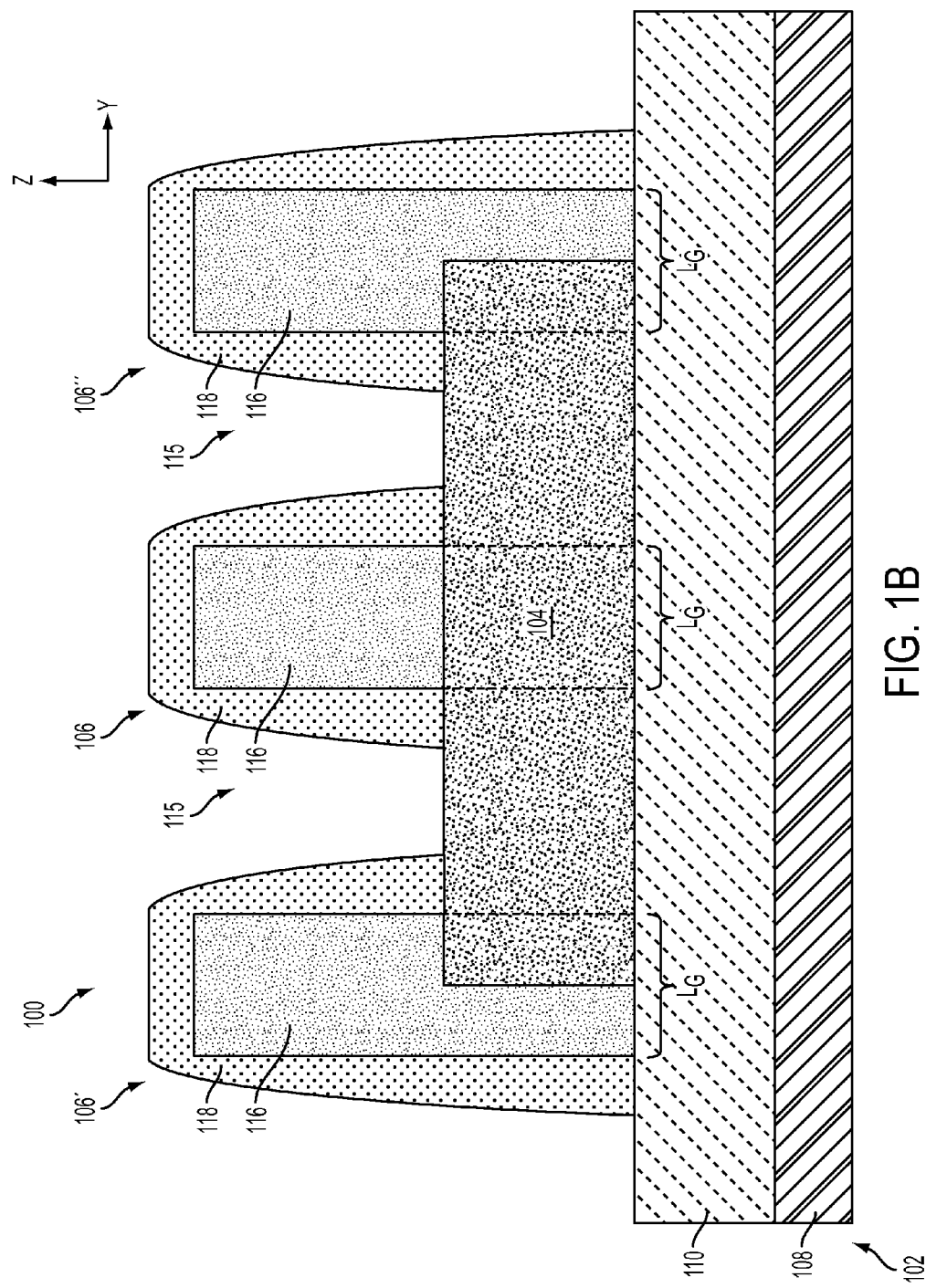
FIG. 1B is a second orientation taken along line A-A' of the semiconductor device illustrated in FIG. 1.

With reference now to FIGS. 1A and 1B, a semiconductor structure 100 which serves as a starting point for fabricating a finFET device in accordance with an exemplary embodiment is shown. In exemplary embodiments, the semiconductor structure 100 includes a semiconductor substrate 102, a plurality of semiconductor fins 104, and one or more gate stacks 106. The semiconductor substrate 102 extends along a first direction (e.g., X-axis) to define a length and a second direction (Y-axis) to define a width.

According to at least one embodiment, the semiconductor substrate 102 is formed as a semiconductor-on-insulator (SOI) substrate 102 as understood by one of ordinary skill in the art. The SOI substrate 102 includes a bulk substrate layer 108 and an insulator layer 110 disposed on the bulk substrate layer 108. The bulk substrate layer 108 is formed from a semiconductor material such as, for example, silicon (Si). The insulator layer 110 is formed as a buried oxide (BOX) layer, and may comprises various dielectric materials including, but not limited to, silicon dioxide ($SiO_2$).

The semiconductor fins 104 are formed on an upper surface of the insulator layer 110 and are arranged sequentially along the length of the SOI substrate 102. Accordingly, the insulator layer 110 is interposed between the bulk substrate layer 108 and the plurality of semiconductor fins 104. Each semiconductor fin 104 is spaced apart from one another according to a fin pitch such that a void 112 exists between each adjacent fin 104. The semiconductor fins 104 are formed from an active semiconductor material including, but not limited to, Si. Each semiconductor fin 104 includes a pair of opposing spacers 114. The spacers 114 are formed on opposing sidewalls of a respective fin 104. The spacers 114 are formed from, for example, silicon nitride (SiN).

The gate stacks 106 are formed on the insulator layer 110 and are separated by one another according to a gate pitch to define respective gate voids 115 therebetween. Each gate stack 106 extends perpendicular to the semiconductor fins 104 to define a gate length ($L_G$). In this regard, one or more gate stacks 106 are formed on an upper surface of the semiconductor fins 104 and wrap around the exterior surface of the spacers 114. According to an embodiment, a first gate stack 106 completely wraps around a middle portion of a respective semiconductor fin 104, while second and third gate stacks 106'/106" partially wrap around end portions of the respective semiconductor fin 104 as illustrated in FIGS. 1A and 1B. Each gate stack 106/106'/106" includes a sacrificial gate element 116 and gate cap 118. The sacrificial gate element 116 is formed from, for example, polysilicon (PC). The gate cap 118 is formed on the sidewalls and the upper surface of the sacrificial gate element 114. The gate cap 118 may be formed from various materials including, for example, SiN. Although FIG. 1B shows a semiconductor fin 104 extending partially through gate stacks 106'/106", it is appreciated that the other embodiments include a semiconductor fin 104 that extends completely through stacks 106'/106".

Figure 2A:
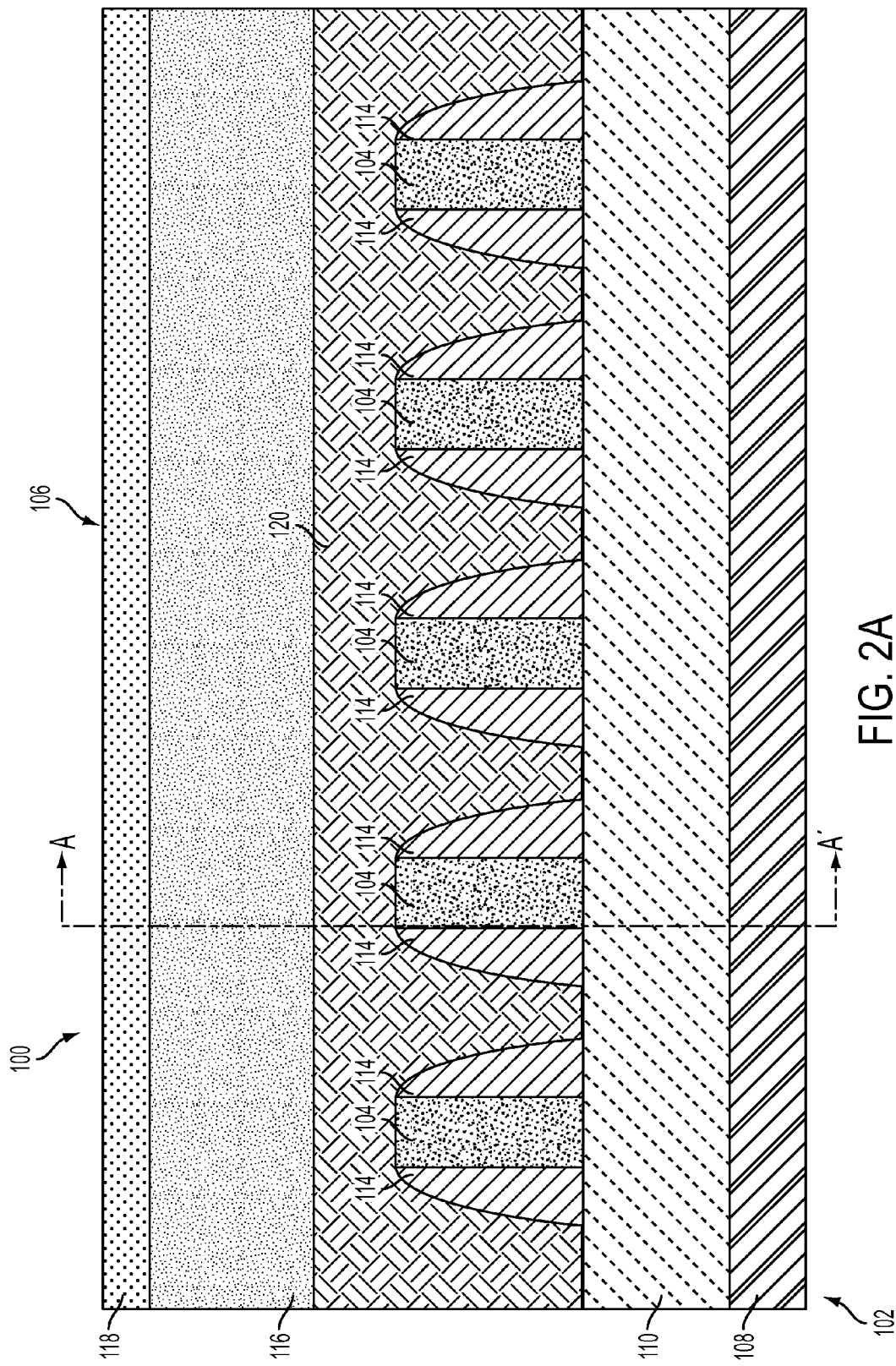
FIG. 2A illustrates the semiconductor device shown in FIGS. 1A-1B according to the first orientation following deposition of a dielectric layer between the semiconductor fins.
Figure 2B:
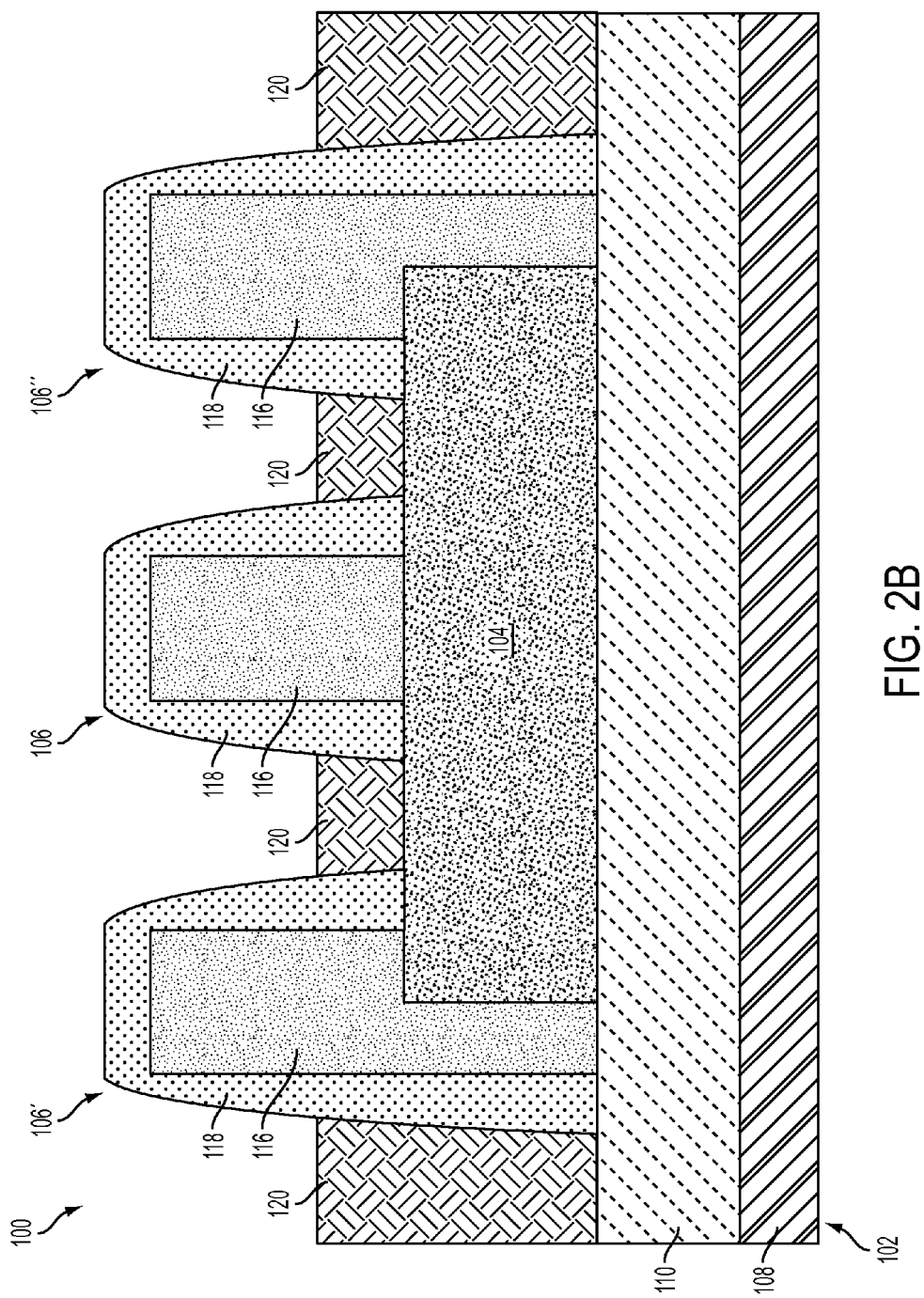
FIG. 2B illustrates the semiconductor device of FIG. 2A according to the second orientation.

Turning now to FIGS. 2A and 2B, a dielectric layer 120 is formed between the semiconductor fins 104. According to at least one embodiment, the dielectric layer 120 is a flowable oxide (FOX) material that is deposited in the fin voids 112 located between each semiconductor fin 104, and extends above the upper surface of the semiconductor fins 104. The flowable oxide is deposited using a spin-coating process, for example, as understood by one of ordinary skill in the art. The flowable oxide material is formed comprises, for example, $SiO_2$.

Figure 3A:
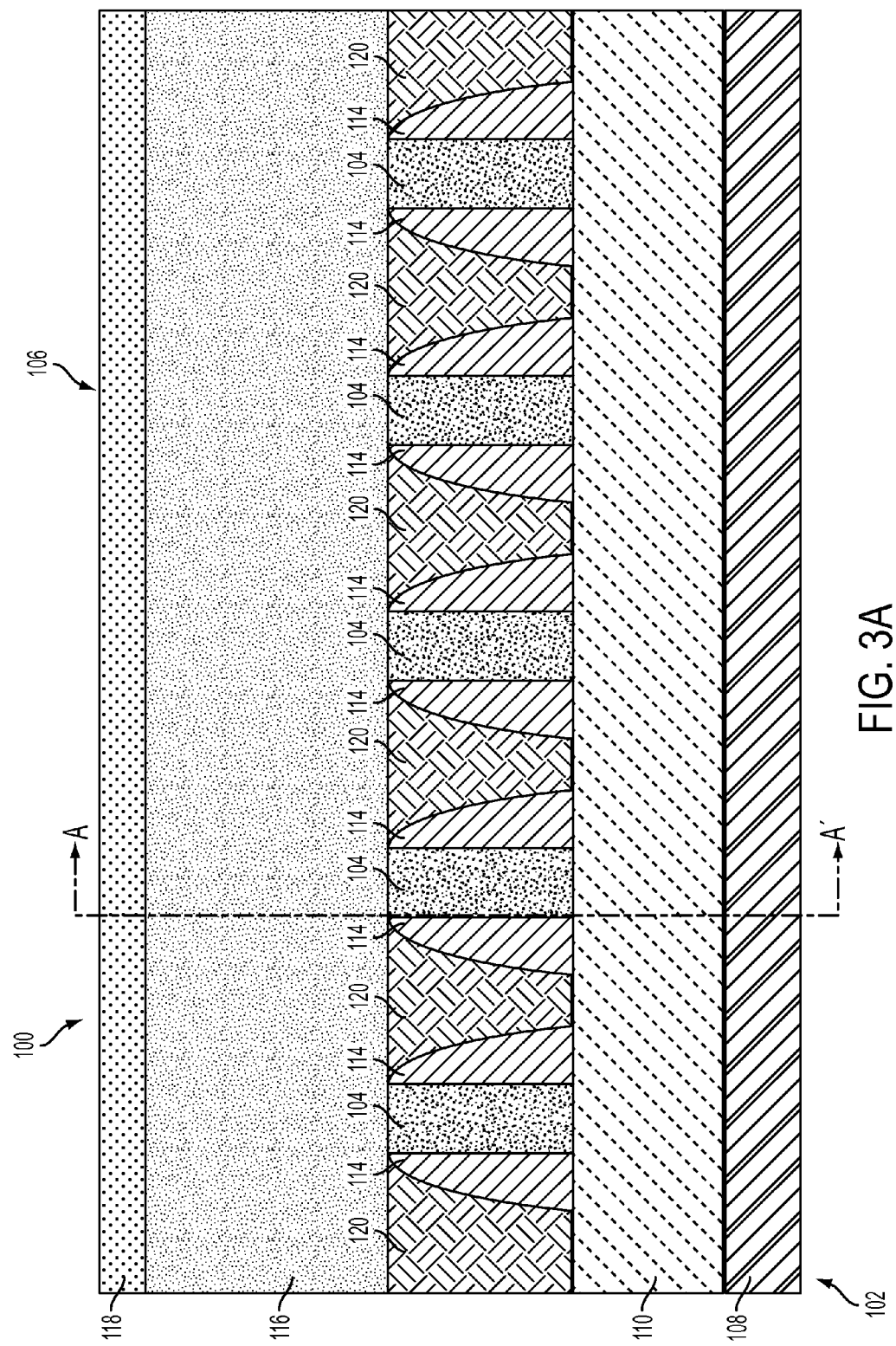
FIG. 3A illustrates the semiconductor device shown in FIGS. 2A-2B according to the first orientation following an etching process that planarizes the dielectric layer and stops on an upper surface of the semiconductor fin.
Figure 3B:
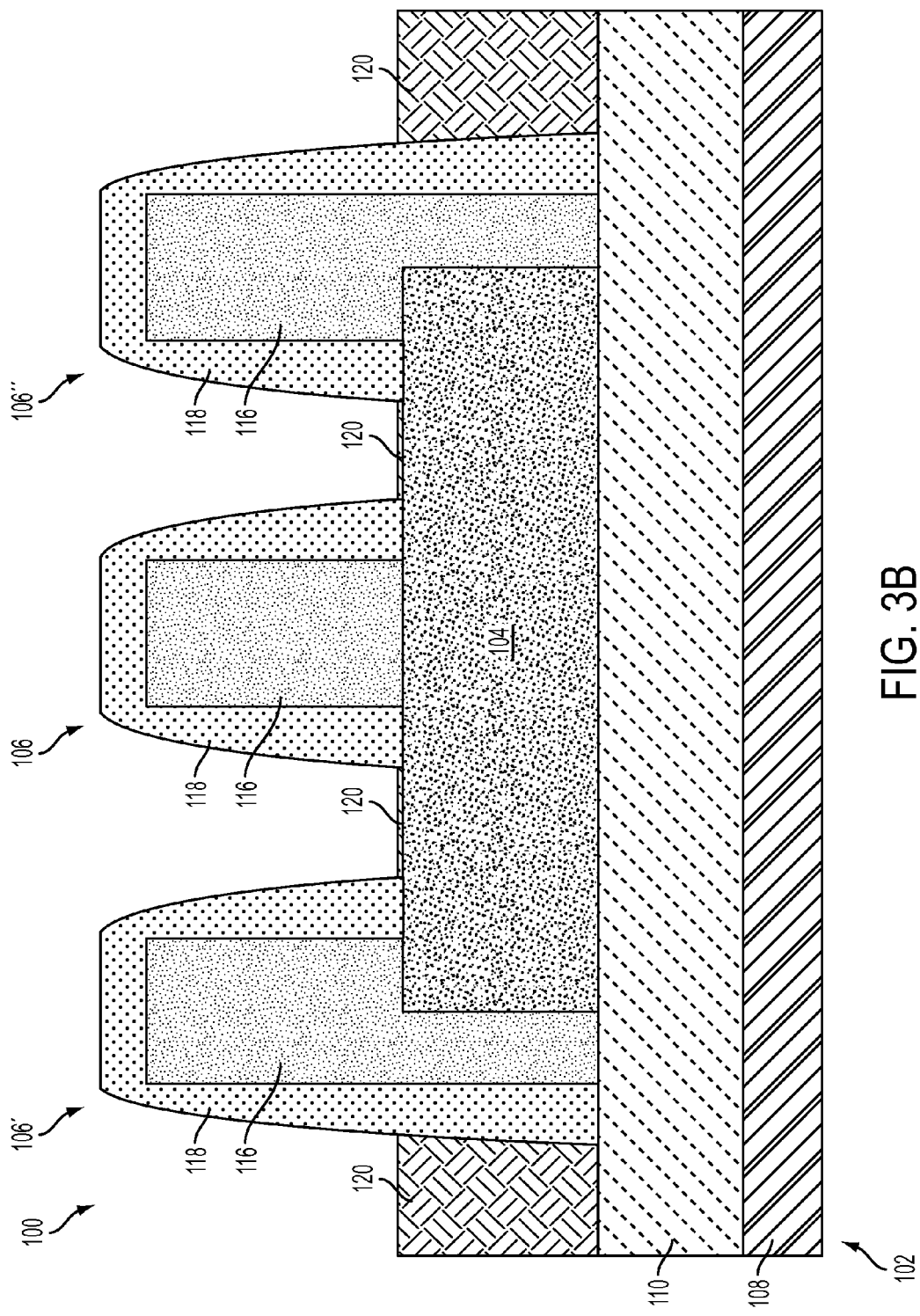
FIG. 3B illustrates the semiconductor device of FIG. 3A according to the second orientation.

Referring now to FIGS. 3A and 3B, an etching process is applied to the dielectric layer 120. Various etching processes may be used including, but not limited to, a dry reactive ion etch (RIE) process that is selective to the material of the semiconductor fins (e.g., Si). In this regard, the upper surface of the dielectric layer 120 is formed flush with the upper surfaces of the semiconductor fins 104.

Figure 4A:
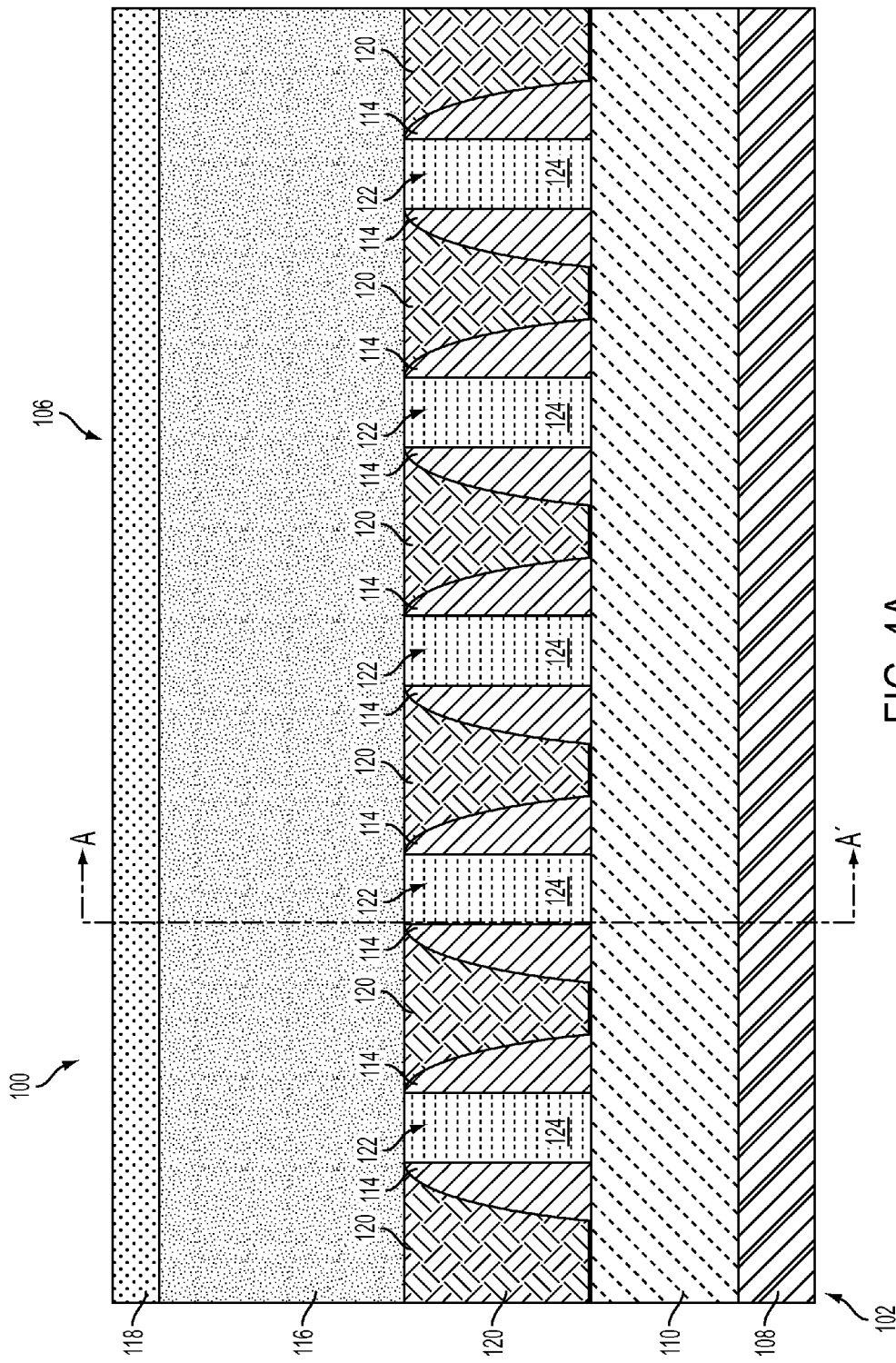
FIG. 4A illustrates the semiconductor device shown in FIGS. 3A-3B according to the first orientation after etching a portion of the semiconductor fins until reaching the insulator layer to form cavities in the fins.
Figure 4B:
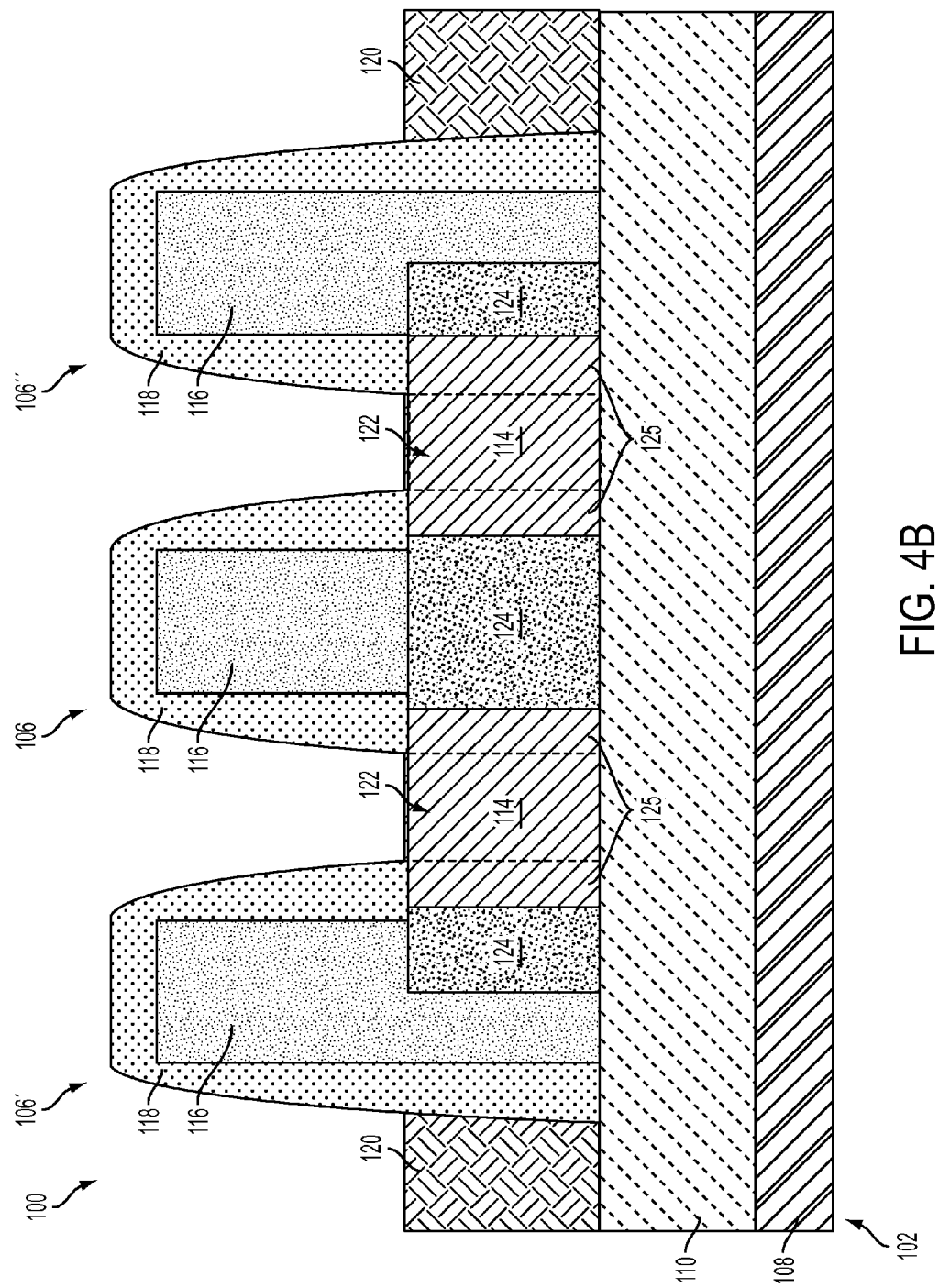
FIG. 4B illustrates the semiconductor device of FIG. 4A according to the second orientation.

Turning to FIGS. 4A and 4B, a portion of each semiconductor fin 104 is etched selective to the spacers 114, the dielectric layer 120, and the insulator layer 110. According to at least one embodiment, the semiconductor fin 104 is etched completely while stopping on the insulator layer 110 and without etching the spacers 114 (i.e., the insulator layer 110 and the spacers 114 remain intact). Accordingly, the spacers 114 and the dielectric layer 120 surrounding the etched portion of the semiconductor fin 104 define a cavity 122. Each cavity 122 is also located between a pair of gate stacks 106.

The cavities 122 divide the semiconductor fin 104 into one or more seed regions 124 capable of growing an epitaxial material as described in greater detail below. Various etching processes may be used to form the cavities 122 such as, for example, an anisotropic dry etching process capable of etching the semiconductor fin 104 in a vertical direction. According to at least one embodiment, the seed regions 124 are aligned with the gate cap 118 such that an exposed surface of each seed region 124 is flush with an outer surface of a respective gate cap 118.

As further illustrated in FIG. 4B, the anisotropic etching process may be followed by a timed isotropic etching process that laterally etched the semiconductor fin 104 (i.e., horizontal with respect to the vertical etching direction). The isotropic etching process undercuts the seed region 124 beneath the spacer 114 and/or gate element 116 to define an undercut region 125 and to define a thickness of the seed region 124. The timing of the etching process may be varied to control size of the undercut region 125, the thickness of the seed region 124, an amount at which the seed layer 124 underlaps or overlaps the gate cap 118 and/or the sacrificial gate element 116.

Figure 5A:
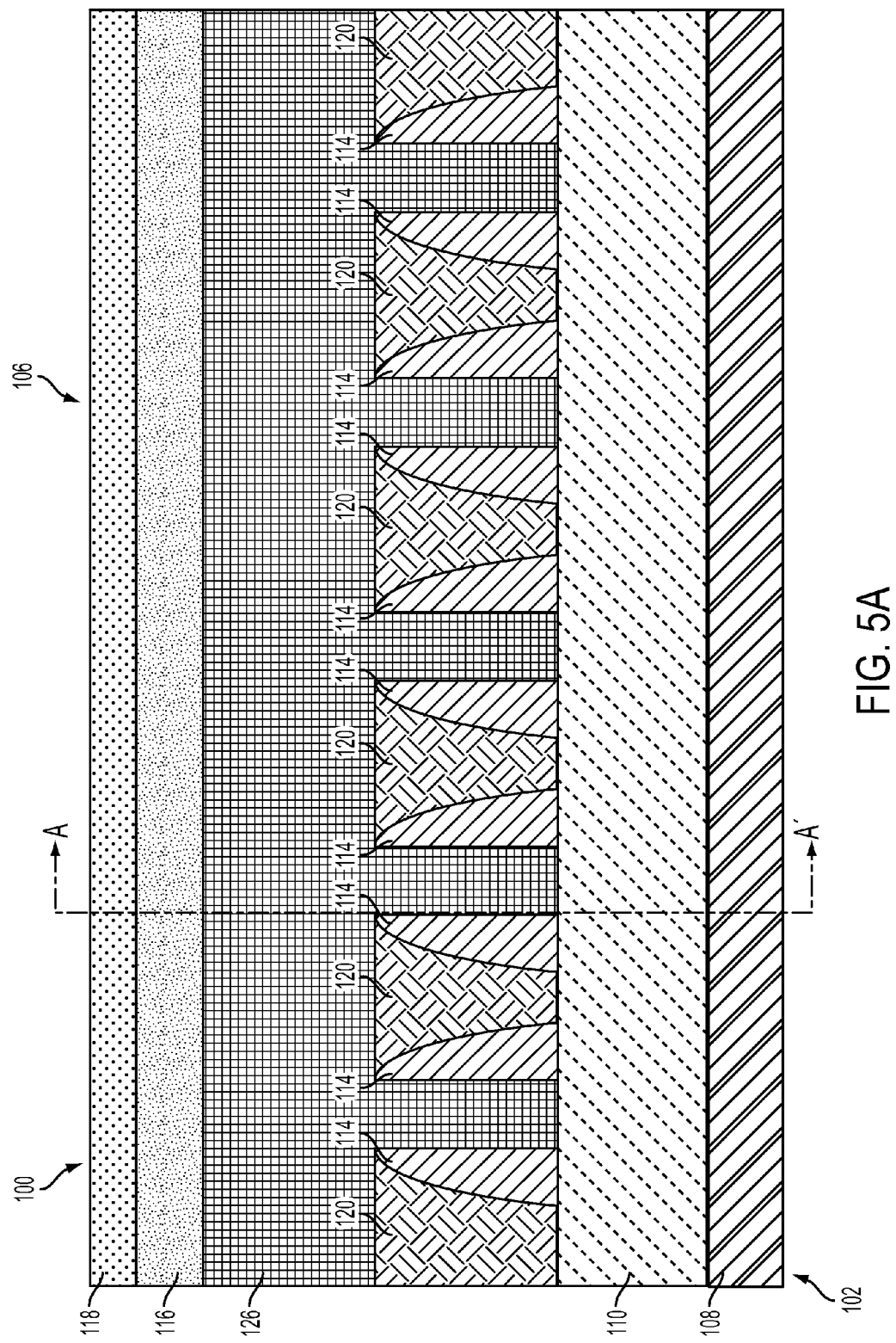
FIG. 5A illustrates the semiconductor device shown in FIGS. 4A-4B according to the first orientation after epitaxially growing a semiconductor material from remaining portions of the semiconductor fins exposed by the cavities to form corresponding source/drain regions.
Figure 5B:
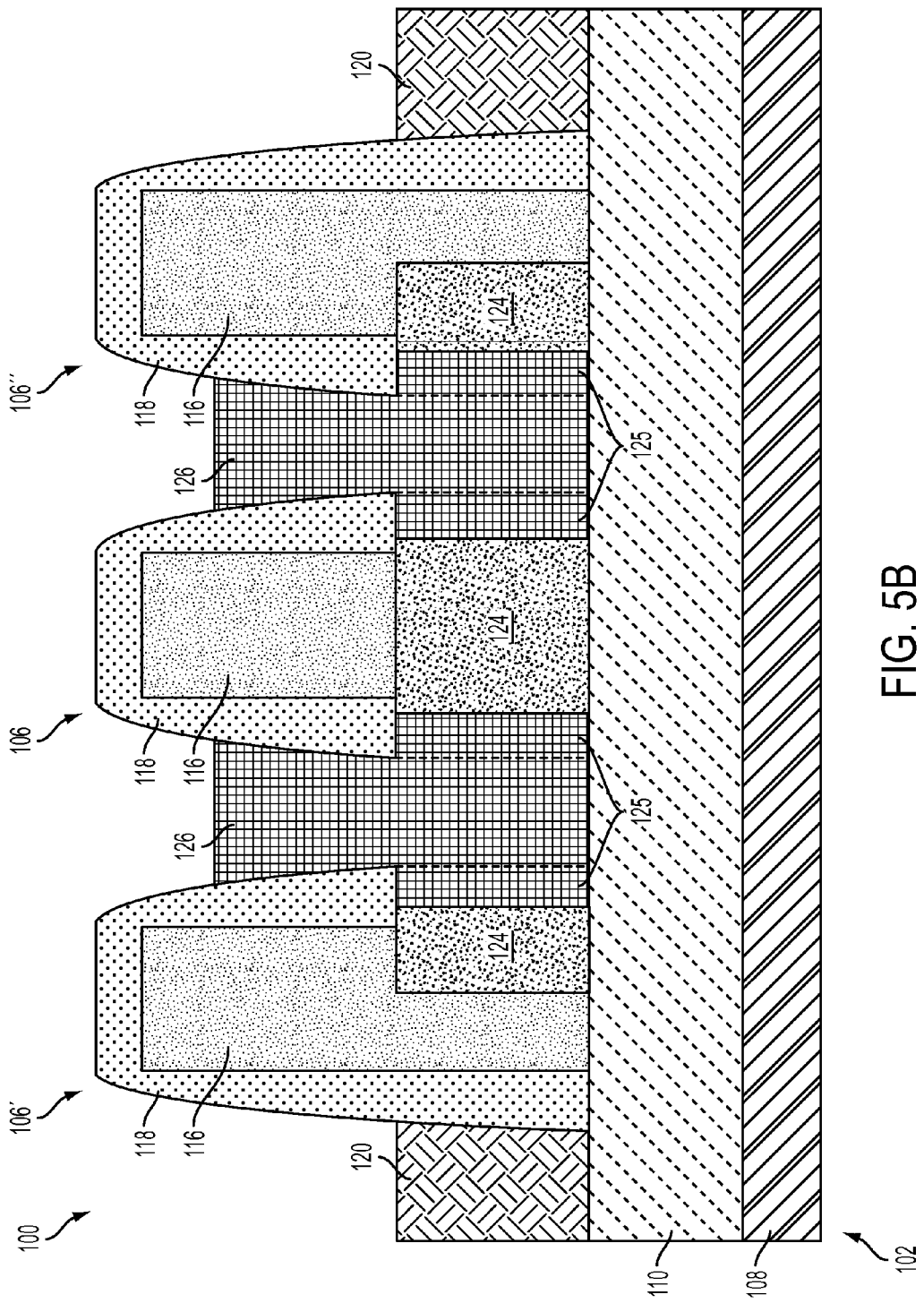
FIG. 5B illustrates the semiconductor device of FIG. 5A according to the second orientation.

Referring now to FIGS. 5A and 5B, an epitaxial material 126 is grown from the seed regions 124 in a manner as understood by those ordinarily skilled in the art. The epitaxial material fills the cavities 122 and the undercut regions 125 to form abrupt source/drain (S/D) regions directly against the seed regions 124. According to at least one embodiment, the epitaxial material 126 is in-situ doped Si or SiGe and is overgrown above the semiconductor fins 104 to ensure sufficient epi merging between adjacent gate stacks 106/106'/106". The overgrowth of the epitaxial material 125 also merges ion diffusion between adjacent gate stacks 106/106'/106".

Each cavity 122 is also configured to constrain the growth of the epitaxial material 124. For example, the epitaxial material 124 grown in the x-direction and the y-direction is restricted and controlled by the distance between opposing fin spacers 114 and the distance between corresponding opposing seed regions 124 which define the dimensions of the cavity 122, instead of growing freely at remote areas of the semiconductor substrate 102. Accordingly, the epitaxial material 126 will have straight sidewalls due to the pre-existing fin spacers which confine growth in that direction. That is, the epitaxially grown semiconductor material includes straight sidewalls induced by the fin spacers, as opposed to diamond-shaped sidewalls. Accordingly, the epitaxial material 126 forms S/D regions corresponding to a respective gate stack 106. As described above, it is appreciated that other embodiments allow for extending the semiconductor fin 104 completely through gate stacks 106'/106". Therefore, S/D regions corresponding to gate stacks 106'/106" are capable of being formed in a similar manner as described above.

Figure 6A:
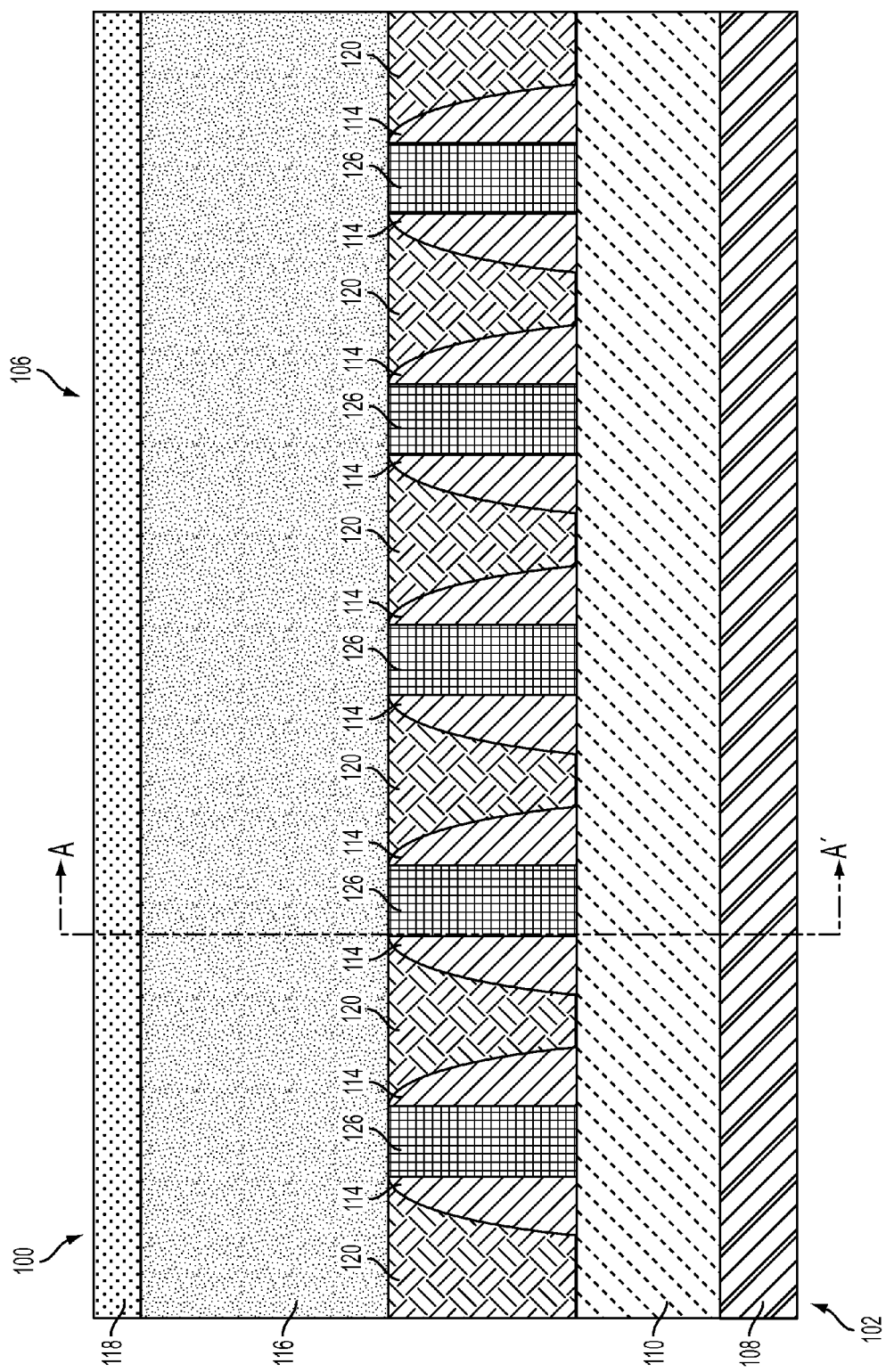
FIG. 6A illustrates the semiconductor device shown in FIGS. 5A-5B according to the first orientation following an etching process that planarizes the epitaxial material with respect to the dielectric material.
Figure 6B:
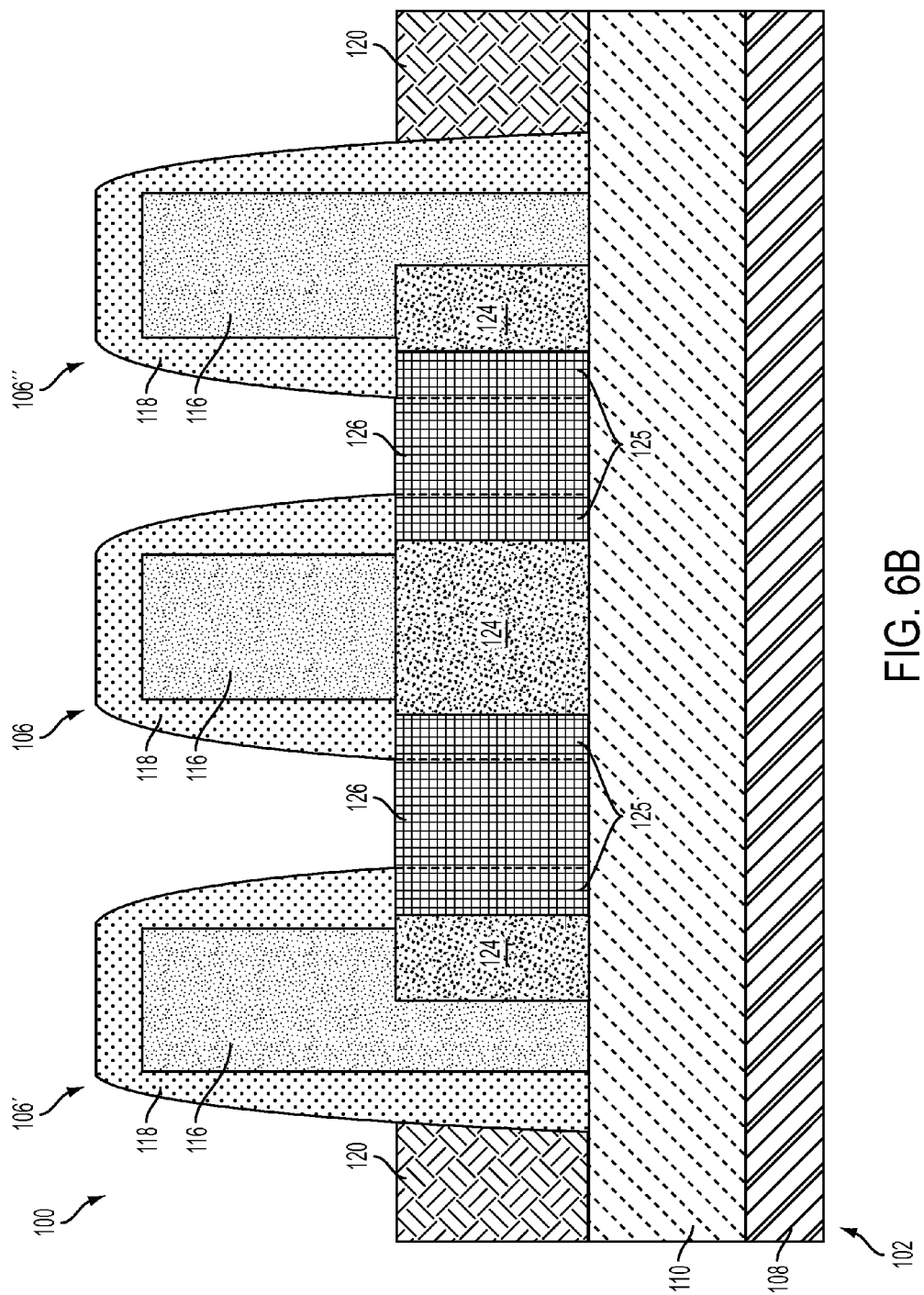
FIG. 6B illustrates the semiconductor device of FIG. 6A according to the second orientation.

Turning to FIGS. 6A and 6B, the epitaxial material 126 is etched using, for example, a dry etching process that is selective to the material of the dielectric layer 120, i.e., the FOX material. In this regard, the dielectric layer 120 is configured as an etch stop such that the upper surfaces of the epitaxial grown S/D regions 126 are formed flush with the upper surface of the dielectric layer 120. Accordingly, the diffusion profile of the S/D regions 126 is controlled. From this point, semiconductor processing as known in the art may continue.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A semiconductor device comprising:
   a semiconductor fin formed on an insulator layer of a semiconductor on insulator substrate, the semiconductor fin including at least one pair of opposing seed regions and an epitaxial material formed on the opposing seed regions and extending completely therebetween to define a corresponding source/drain region; and
   at least one gate stack formed on the insulator layer and wrapping over at least one seed region.

2. The semiconductor device of claim 1, wherein the semiconductor fin includes fin spacers on opposing sidewalls of the fin and the epitaxial material is formed between the spacers, the epitaxial material is formed between the spacers having straight sidewalls.

3. The semiconductor device of claim 2, wherein the gate stack includes a gate element and a gate cap formed on the sacrificial gate element, the gate element formed on the at least one seed region and the gate cap formed on the epitaxial material.

4. The semiconductor device of claim 3, wherein the at least one seed region is flush with respect to the gate spacer.

5. The semiconductor device of claim 3, wherein the at least one seed region is overlapped with respect to the gate cap.

6. The semiconductor device of claim 3, wherein the at least one seed region is underlapped with respect to the gate cap.

7. The semiconductor device of claim 6, wherein the semiconductor fins are formed from silicon and the epitaxial material is in-situ doped with Si or SiGe.

8. The semiconductor device of claim 7, wherein the epitaxial material merges adjacent gate stacks.

9. The semiconductor device of claim 8, wherein the semiconductor device further comprises dielectric layer formed on the insulator layer, and between the semiconductor fins and the gate stacks, and wherein an upper surface of the epitaxial material is flush with an upper surface of the dielectric layer.

* * * * *